United States Patent
Syed et al.

(10) Patent No.: US 11,810,875 B2
(45) Date of Patent: Nov. 7, 2023

(54) PACKAGED INTEGRATED CIRCUIT DEVICE WITH BUILT-IN BALUNS

(71) Applicant: NXP B.V., Eindhoven (NL)

(72) Inventors: Waqas Hassan Syed, Eindhoven (NL); Cicero Silveira Vaucher, Eindhoven (NL); Antonius Johannes Matheus de Graauw, Haelen (NL)

(73) Assignee: NXP B.V., Eindhoven (NL)

( * ) Notice: Subject to any disclaimer, the term of this patent is extended or adjusted under 35 U.S.C. 154(b) by 265 days.

(21) Appl. No.: 17/226,376

(22) Filed: Apr. 9, 2021

(65) Prior Publication Data
US 2022/0328432 A1    Oct. 13, 2022

(51) Int. Cl.
| | |
|---|---|
| *H01L 23/66* | (2006.01) |
| *G01S 7/02* | (2006.01) |
| *G01S 13/931* | (2020.01) |
| *H01L 23/498* | (2006.01) |
| *H03H 7/42* | (2006.01) |

(52) U.S. Cl.
CPC ............. *H01L 23/66* (2013.01); *G01S 7/028* (2021.05); *G01S 13/931* (2013.01); *H01L 23/49816* (2013.01); *H03H 7/42* (2013.01); *H01L 2223/6616* (2013.01); *H01L 2223/6638* (2013.01); *H01L 2223/6677* (2013.01); *H01L 2223/6683* (2013.01)

(58) Field of Classification Search
CPC ............... H01L 23/66; H01L 23/49816; H01L 23/49838; H01L 2223/6638; H01L 2223/6683; G01S 7/028; G01S 13/931; H03H 7/42
See application file for complete search history.

(56) References Cited

U.S. PATENT DOCUMENTS

| | | | |
|---|---|---|---|
| 7,138,884 B2 | 11/2006 | Cheung et al. | |
| 9,435,842 B2 | 9/2016 | Vaucher et al. | |
| 9,666,553 B2 | 5/2017 | Murugan et al. | |
| 10,305,533 B2 * | 5/2019 | Mizokami | H03H 7/0115 |

(Continued)

OTHER PUBLICATIONS

Li Zhong-Yun et al: "Design and implementation of a LTCC-based receiver front-end module", Microwave and Millimeter Wave Technology (ICMMT), 2010 International Conference on, IEEE, Piscataway, NJ, USA, May 8, 2010, pp. 1053-1056.

(Continued)

*Primary Examiner* — Dao H Nguyen

(57) ABSTRACT

A packaged integrated circuit (IC) includes an IC die having first and second external contacts and a package substrate. The IC die is attached to the package substrate which includes a balun in a first metal layer. The balun is connected to the first and second external contacts of the IC die and to a first external contact of the package substrate. The first and second external contacts of the IC die communicate a differential signal with the package substrate, and the first external contact of the package substrate communicates a single-ended signal corresponding to the differential signal. Alternatively, the balun is connected to an external contact of the IC die and to first and second external contacts of the package substrate, in which the external contact of the IC die communicates a single-ended signal and the first and second external contacts of the package substrate communicate a differential signal.

17 Claims, 5 Drawing Sheets

(56) References Cited

U.S. PATENT DOCUMENTS

| | | | |
|---|---|---|---|
| 2006/0001501 A1* | 1/2006 | He | H01P 5/10 |
| | | | 333/25 |
| 2010/0026411 A1* | 2/2010 | Liu | H03H 7/42 |
| | | | 333/25 |
| 2012/0154071 A1* | 6/2012 | Bradley | H03H 7/38 |
| | | | 333/32 |
| 2016/0190673 A1 | 6/2016 | Huang et al. | |
| 2019/0173176 A1 | 6/2019 | Kim et al. | |
| 2020/0253040 A1 | 8/2020 | Dalmia et al. | |
| 2020/0344872 A1 | 10/2020 | El Sabbagh et al. | |
| 2022/0320021 A1* | 10/2022 | Chamas | H01L 23/5227 |
| 2023/0124600 A1* | 4/2023 | Akhtar | H05K 1/0245 |
| | | | 333/25 |

OTHER PUBLICATIONS

Rotaru et al: "Implementation of Packaged Integrated Antenna With Embedded Front End for Bluetooth Applications", IEEE Transactions on Advanced Packaging, IEEE Service Center, Piscataway, NJ, USA, vol. 31, No. 3, Aug. 1, 2008, pp. 558-567.

Inui et al., "On-Chip S-Shaped Rat-Race Balun for Millimeter-Wave Band Using Wafer-Level Chip-Size Package Process," Proceedings of the 3rd European Microwave Integrated Circuits Conference, 2008, 4 pages.

NXP Semiconductor, "TEF810X, 76 GHz to 81 GHz car RADAR transceiver, Product short data sheet," Rev. 1.0, May 10, 2019, 13 pages.

Dib et al., "Broadband Uniplanar Microstrip to Slot-Line Transitions," 1995 IEEE MTT-S Digest, 4 pages.

* cited by examiner

PACKAGED INTEGRATED CIRCUIT DEVICE WITH BUILT-IN BALUNS

BACKGROUND

Field

This disclosure relates generally to packaged integrated circuit devices, and more specifically, to packaged integrated circuit devices with built-in baluns.

Related Art

High performance millimeter-wave interfaces are needed to maximize the performance of the monolithic microwave integrated circuits (MMIC). A cost-effective and performance-driven packaging technique to connect MMICs input output (IO) signals to the printed circuit board (PCB) can be realized by using a ball-grid-array-based (BGA) package structure. Examples of these packages are embedded wafer level ball grid array (eWLB), flip-chip chip-scale package (FCCSP) and flip-chip ball-grid array (FCBGA).

A galvanic connection from the MMIC silicon die to the PCB board is typically used, which includes two intermediate transitions. A first transition is a die-to-package transition, which connects the die to the package substrate laminates, or the die to a metallization layer on top of a dielectric layer of the package substrate. A differential implementation of the silicon circuitry is often used, as this decreases the sensitivity of the active circuitry to external common-mode signals present, for example, on the PCB lines or traces on a package laminate. As a consequence of the differential circuit implementation, the transition from die to package will be differential as well.

The second transition is the package-to-PCB interface, which connects the package to the PCB using the solder-ball ball-grid array. This interface can be designed to be either differential or single-ended. A differential implementation requires two signal lines, which can occupy space on the PCB and may cause routing constraints for the power, ground and other digital connections on the PCB. Consequently, single-ended connections are often used on the PCB to, for example, feed single-ended antennas. Another reason is that routing using a single-ended transmission lines may be easier to accomplish than balanced differential transmission lines.

In some mm-wave packages used for automotive RADAR, all mm-wave interfaces are differential at the die-to-package and at the package-to-PCB interface. This means that an additional circuit component to convert from balanced-to-single ended (unbalanced) signals must be added on the PCB. This circuit component is generally called a balun and is used to measure performance using equipment with probes, or to connect to the standard microstrip based antenna to radiate power in free space.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments disclosed herein provide a packaged mm-wave integrated circuit (IC) device with a built-in balun component that reduces area that would otherwise be required by the balun on a printed circuit board (PCB). A single-ended package to PCB interface is also provided. The packaged IC device uses a differential die-to-package interface to mitigate common mode signals on the PCB or package laminate being coupled to the die. Integrated shielding for the balun is obtained using a multi-layer laminate package substrate to suppress the crosstalk between channels. In addition, shielded coaxial transition is integrated in the package to PCB interface to lower radiation losses and suppress crosstalk between channels for core and coreless flip chip chip scale package (fcCSP) formats. Embodiments of the IC device can use any ball grid array package technology that includes two or more metal redistribution layers inside the package.

Figure 1:
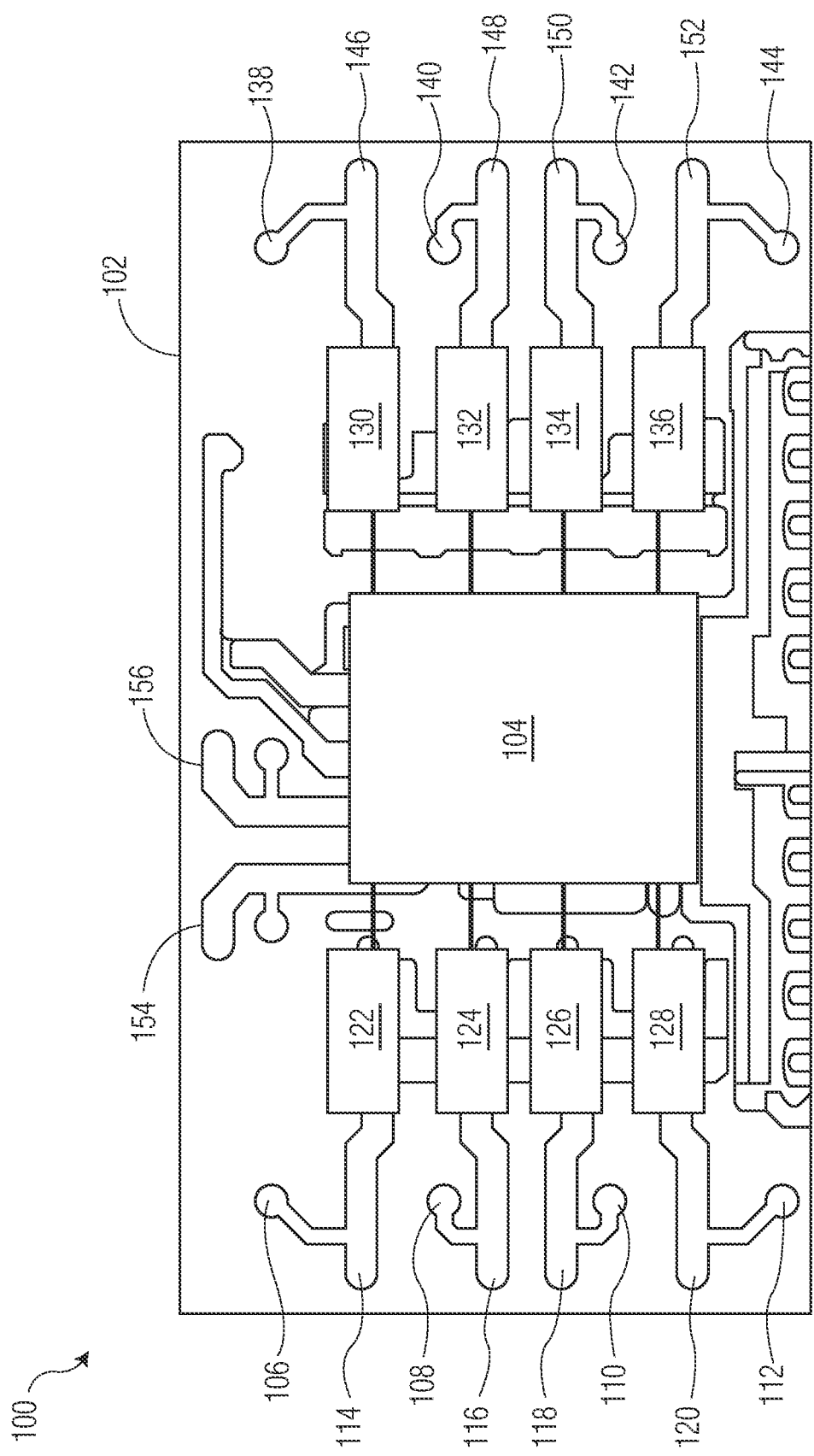
FIG. 1 illustrates a top view diagram of components of an integrated circuit device in accordance with selected embodiments of the present invention.

FIG. 1 illustrates a top view diagram of components that can be included in integrated circuit (IC) device 100 in accordance with selected embodiments of the present invention. In the example shown, IC device 100 includes chip substrate 102, processing die 104, signal vias 106-112 and 138-144, baluns 114-120 and 146-152, receiver circuitry 122-128, and transmitter circuitry 130-136. In some contexts, packaged IC device 100 may be referred to as a millimeter wave integrated circuit (MMIC) chip with die 104 being an MMIC die. Receiver circuitry 122-128 and transmitter circuitry 130-136 can alternatively be embedded within processing die 104.

Chip substrate 102, also referred to as a laminate substrate, can include one or more metal layers embedded in or formed on or between dielectric layers. Chip substrate 102 connects processing die 104, receiver circuitry 122-128, and transmitter circuitry 130-136 to a PCB (not shown) through a conductive network of traces and holes filled with conductive material, also referred to as vias. Chip substrate 102 supports functions including circuit support and protection, heat dissipation, and signal and power distribution. When using the fcCSP format, IC device 100 is connected to a PCB through a matrix of solder balls or copper pillars rather than wire bonding. Other suitable substrate formats can be utilized, however.

Processing die 104 can include one or more processing cores, volatile and non-volatile memory devices, connectivity circuitry, network interfaces, software programs stored on one or more memory devices and executable by the processing cores, analog-to-digital converters, digital to analog converters, a temperature sensor, power management circuitry, safety and security circuitry and components, as well as other suitable circuitry and components. Processing die 104 can be coupled to communicate with network transceivers (not shown), power management circuitry (not shown), functional safety circuitry (not shown), receiver circuitry 122-128, and transmitter circuitry 130-136, as well as other suitable circuitry and components.

Signal vias 106-112 and 138-144 can be included in one or more layers of chip substrate 102 to form an electrical connection between antennae (not shown) and processor die 104. Signal vias 106-112 and 138-144 can be fabricated by forming an opening in one or more dielectric layers of substrate 102 and filling the opening with a conductive material. Signal vias 106-112 and 138-144 can be enclosed or protected by an antipad (not shown), where an antipad provides clearance between the opening of signal vias 106-112, 138-144 and a ground metal layer. A trace (not shown) from signal vias 106-112 and 138-144 to the antenna may be formed to allow signals to be transmitted or received between the antenna to processor die 104.

Signal vias 106-112 for receiver circuitry 122-128 are connected to respective baluns 114-120 and signal vias 138-144 for transmitter circuitry 130-136 are connected to respective baluns 146-152. Receiver circuitries 122-128 are connected to respective baluns 114-120. Transmitter circuitries 130-136 are connected to respective baluns 146-152. In some embodiments, conductive traces between signal vias 106-112 and 138-114 are single-ended conductive lines that are coupled to single ended antennae, with one antenna coupled to a respective one of signal vias 106-112, 138-144. Accordingly, IC device 100 can communicate differential signals between processor die 104 and baluns 114-120, 146-152, and single-ended signals between baluns 114-120, 146-152 and respective receive and transmit antennae. Note that in other embodiments, baluns 114-120 can be configured with a single ended connection at processor die 104 and double-ended or differential connections to signal vias 106-112 and 138-114 that are configured to provide respective differential connections to double ended antennae. This means there would be two signal vias per antenna instead of one signal via per antenna.

Each of signal vias 106-112, 138-114 and corresponding baluns 114-120, 146-152 are part of a single communication channel. In some embodiments, the communication channels may use frequency modulated continuous wave (FMCW) devices that operate in a frequency range of 76 to 81 GHz when used for automotive RADAR applications. The channels may be tuned to operate with other scanning technology and frequencies, however, such as with frequencies associated with emerging mmWave 5G systems, for example.

In addition to baluns 114-120, 146-152, baluns 154, 156 can be included in IC device 100 for use with mm-Wave clock signals which are used to synchronize multiple radar or communication transceivers. An example is synchronizing radar transceivers by sharing a local oscillator mm-Wave signal which is generated by an initiator transmitter (not shown) as a differential signal, distributed on the PCB as a single ended signal and received by a responder receiver (not shown) as a differential signal. Balun 154 can therefore be coupled to the responder receiver with a differential signal and balun 156 can be coupled to the initiator transmitter with a single ended signal.

Baluns 114-120 and 146-152 can be fabricated using conductive material in a first metal layer of chip substrate 102 to transform an unbalanced signal to a balanced signal, or vice versa. Baluns 114-120 and 146-152 are formed as an elongated planar loop with one end of the loop connected to a first signal of a differential pair of signals used by respective receiver circuitry 122-128 or transmitter circuitry 130-136, and another end of the loop connected to a second signal of the differential pair of signals used by respective receiver circuitry 122-128 or transmitter circuitry 130-136. At some point along the loop of each of baluns 114-120, 146-152, a single-ended conductive trace is formed to connect each of baluns 114-120, 146-152 to a corresponding one of signal vias 106-112, 138-144.

In RADAR systems, receiver circuitry 122-128 receives signals that echo from an object illuminated by signals transmitted from transmitter circuitry 130-136. When IC device 100 is used for other purposes, the transmit and receive signals can be independent of one another. FIG. 1 shows four channels or chains of receiver circuitry 122-128, however any suitable number of receive channels can be included. Each receive channel can include programmable high-pass filters to suppress strong low frequency signals, as well as low-pass filters to suppress signals in an analog-to-digital converter aliasing band. Each receive channel can also include a programmable decimation filter with a number of decimation factors. Data from the decimation filter can be output on high-speed low-voltage differential signaling, in raw ADC serial data streaming, or in packetized format with added cyclic redundancy check information. A full-duplex Serial Peripheral Interface (SPI) can be included for bidirectional exchange of control and monitoring data between receiver circuitry 122-128 and other components in IC device 100. When used for applications other than RADAR, receiver circuitry 122-128 can include other components in addition to or instead of components required for RADAR applications.

FIG. 1 further shows four channels or chains of transmitter circuitry 130-136, however any suitable number of transmitter channels can be included. Each transmitter channel can include a waveform generator offering flexible chirp control with a chirp bandwidth up to 2 GHz or other suitable frequency. When used for RADAR applications, transmitter circuitry 130-136 can also include binary phase control and output level stabilization, and a timing engine that supports different multiple input-multiple output RADAR operation modes by programming of digital registers controlling timing parameters and front end configuration on a chirp-to-chirp basis. The phase of the transmit signals can be controlled on a chirp-to-chirp basis by a timing engine, or by digital I/O signals directly connected to binary phase shifters of different transmit sections. When used for applications other than RADAR, transmitter circuitry 130-136 can include other components in addition to or instead of components required for RADAR applications.

Note that receiver circuitry 122-128 and transmitter circuitry 130-136 may be configured for uses other than RADAR, such as cell phone or wireless network communications.

Figure 2:
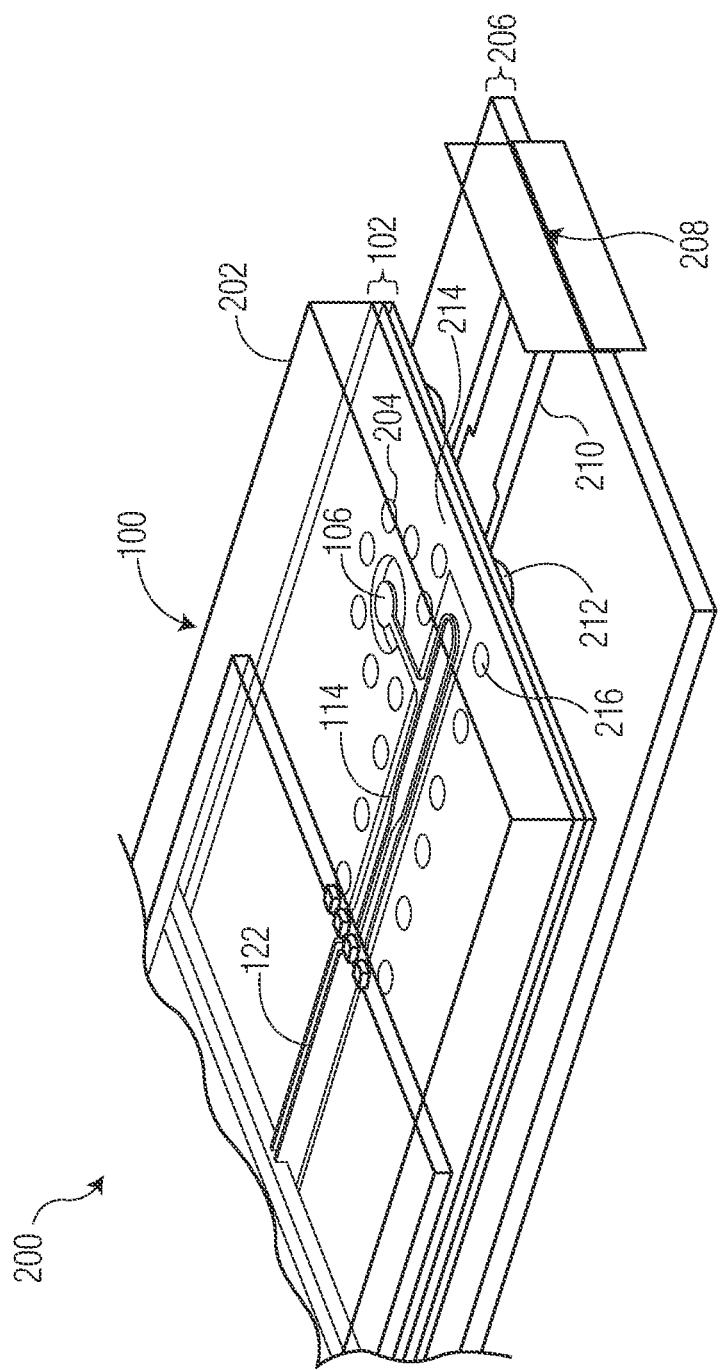
FIG. 2 illustrates a perspective view diagram of a portion of the integrated circuit device of FIG. 1 mounted on a printed circuit board in accordance with selected embodiments of the invention.
Figure 3:
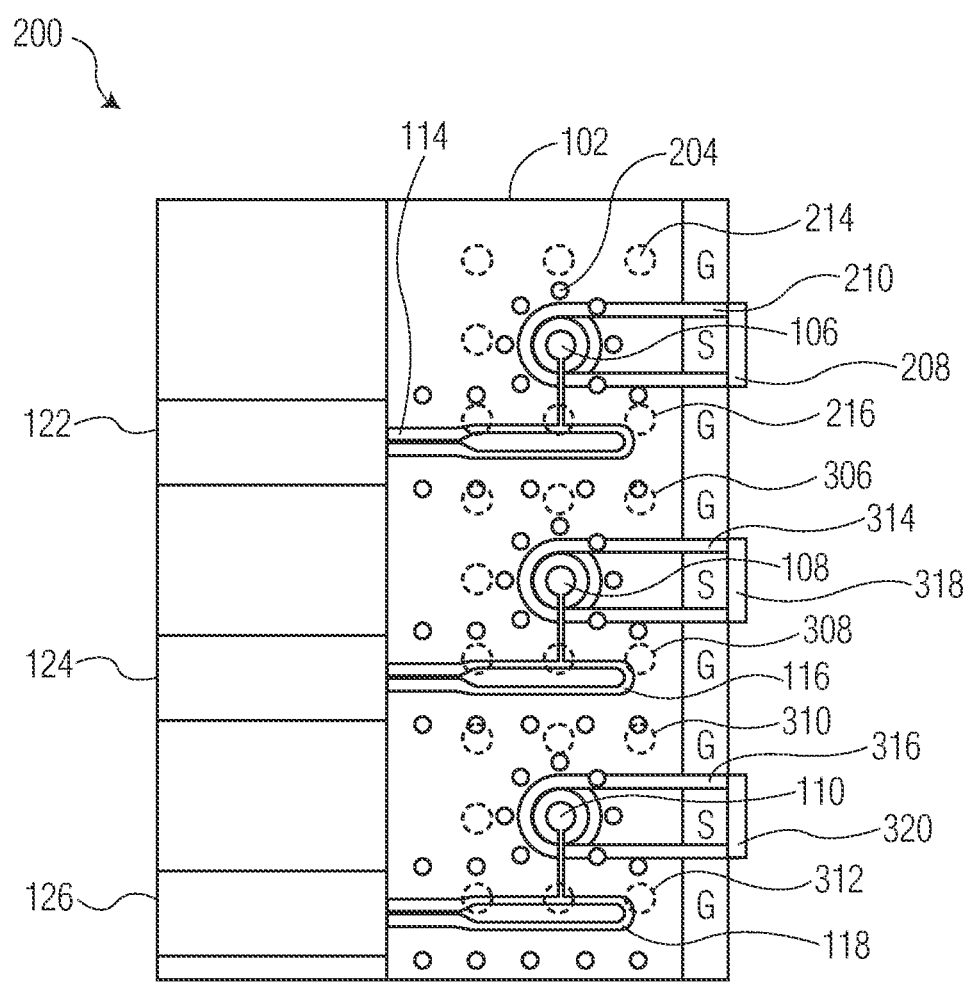
FIG. 3 illustrates a top view diagram of a portion of the integrated circuit device of FIGS. 1 and 2.

Referring to FIGS. 2 and 3, FIG. 2 illustrates a perspective view diagram of integrated circuit device 200 that includes a portion of IC device 100 of FIG. 1 mounted on printed circuit board (PCB) 206 in accordance with selected embodiments of the invention. FIG. 3 illustrates a top view diagram showing multiple channels of receiver circuitry 122-126 and other associated components of IC devices 100 and 200 of FIGS. 1 and 2. In the example shown in FIG. 2, one receive channel including signal via 106, balun 114 and receiver circuitry 122 of processor die 104 are shown on substrate 102 and packaged in encapsulant 202. Ground vias 204 surround signal via 106. A first row of ground vias 214 can be included along the length of one side of balun 114, and a second row of ground vias 216 can be included along the length of another side of balun 114. Ground vias 204, 214, 216 at least partially shield balun 114 and signal via 106 from spurious electromagnetic waves (e.g., radio interference). Ground vias 204, 214, 216 can be connected to a ground metal layer of substrate 102 that can in turn be connected to a ground metal layer in PCB 206 through an array of solder balls 212 that may provide signal connections, ground connections, and power connections.

PCB 206 supports and electrically connects electrical or electronic components such as processor die 104 using conductive tracks, pads and other features etched from one or more sheet layers of conductive material laminated onto and/or between sheet layers of a non-conductive substrate. As best shown in FIG. 3, waveguides in the form of conductive tracks 210, 314, 316 can be included in a top metal layer of PCB 206 and wrap around a portion of corresponding signal vias 106, 108, 110. The ends of conductive tracks 210, 314, 316 extend from corresponding signal vias 106, 108, 110 to antenna ports 208, 318, 320 to transfer signals from an antenna (not shown) to signal vias 106, 108, 110.

Rows of ground vias 214, 216, 306, 308, 310, 312 as shown in dashed circles in FIG. 3 are included on PCB 206 (FIG. 2). Signal via 106 and conductive track 210 are between ground via rows 214 and 216. Ground via rows 216 and 306 are adjacent to one another. Signal via 108 and conductive track 314 are between ground via rows 306 and 308. Ground via rows 308 and 310 are adjacent to one another. Signal via 110 and conductive track 316 are between ground via rows 310 and 312.

Note that a similar configuration of conductive tracks, ground vias and antenna ports can be used for baluns 146, 148, 150, 152 and signal vias 138, 140, 142, 144 attached to transmitter circuitry 130-136 to transfer signals to antennae from transmitter circuitry 130-136.

By including baluns 114, 116, 118 attached and adjacent to signal vias 106, 108, 110, there are two rows of ground vias 216/306, 308/310 in substrate 102 and PCB 206 between each signal via 106, 108, 110. The additional separation and grounding that is achieved by placing rows of ground vias adjacent to one another decreases interference with signals on signal via 106, 108, 110 and conductive traces 210, 314, 316, thereby improving performance of IC device 200.

Figure 4:
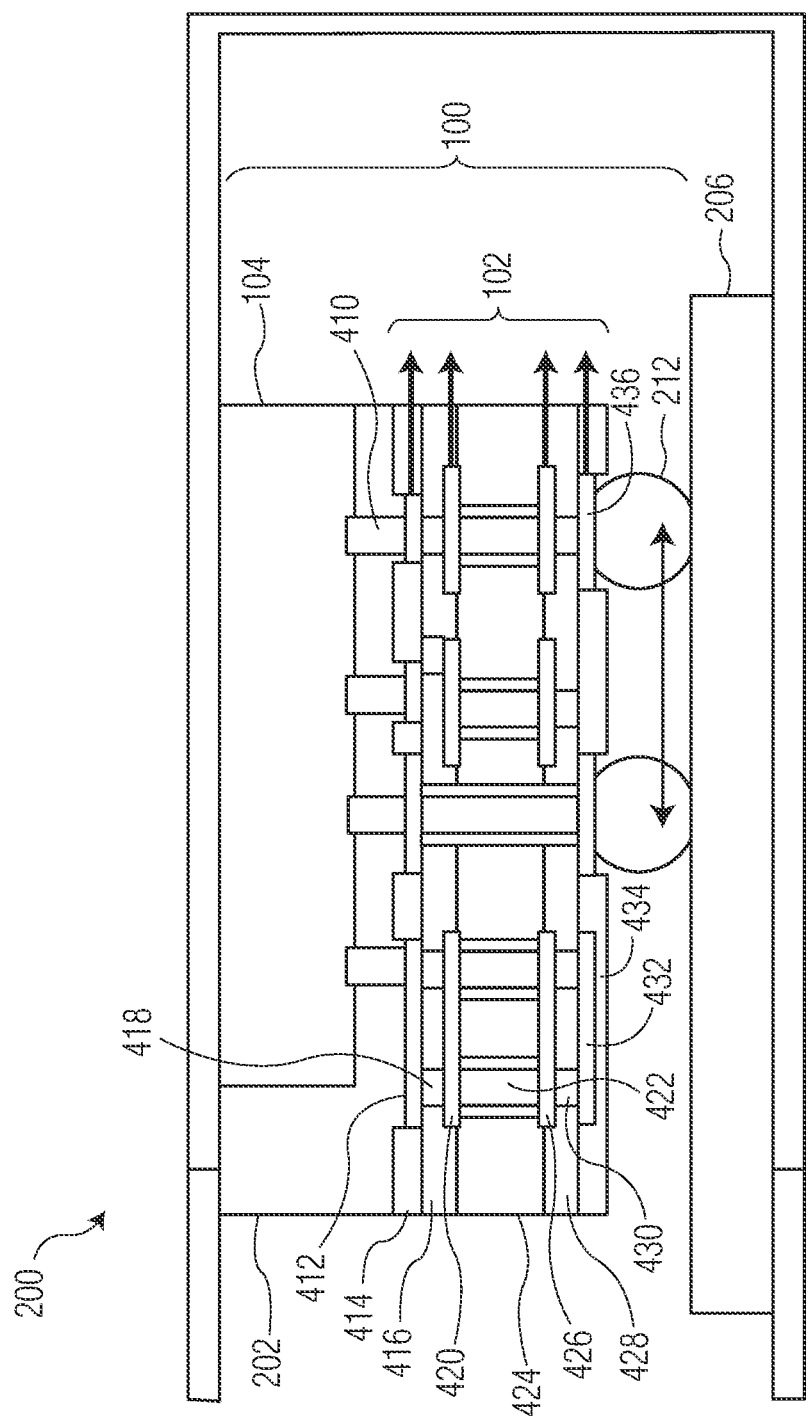
FIG. 4 illustrates a side cross-sectional view diagram of a portion of the integrated circuit device and printed circuit board of FIG. 1

FIG. 4 illustrates a side cross-sectional view diagram of a portion of IC device 200 of FIG. 1 attached to printed circuit board 206 of FIG. 2. Processor die 104 is coupled to substrate 102 with conductive pillars 410. Substrate 102 includes metal layers 414, 420, 426, 432 between dielectric layers 416, 424, 428. Dielectric layer 424 can be a rigid core that is thicker than dielectric layers 416, 428 to provide structure that resists bending of substrate 102. Conductive vias for 18, 422, 430 can be formed in dielectric layers 416, 424, 428 to connect traces in metal layers 414, 420, 426, 432 with one another as specified by a routing design. IC device 200 is coupled to substrate 206 using an array of solder balls 212. Various power ground, power, and data signals can be communicated between integrated circuit 100 and other components on PCB 206 through conductive traces (not shown) on PCB 206. As used herein, electrical ground can be considered a supply voltage VSS.

Baluns 114-120 and 146-152 as shown in FIG. 1 can be formed in metal layer 412 or other suitable location in substrate 102.

Figure 5:
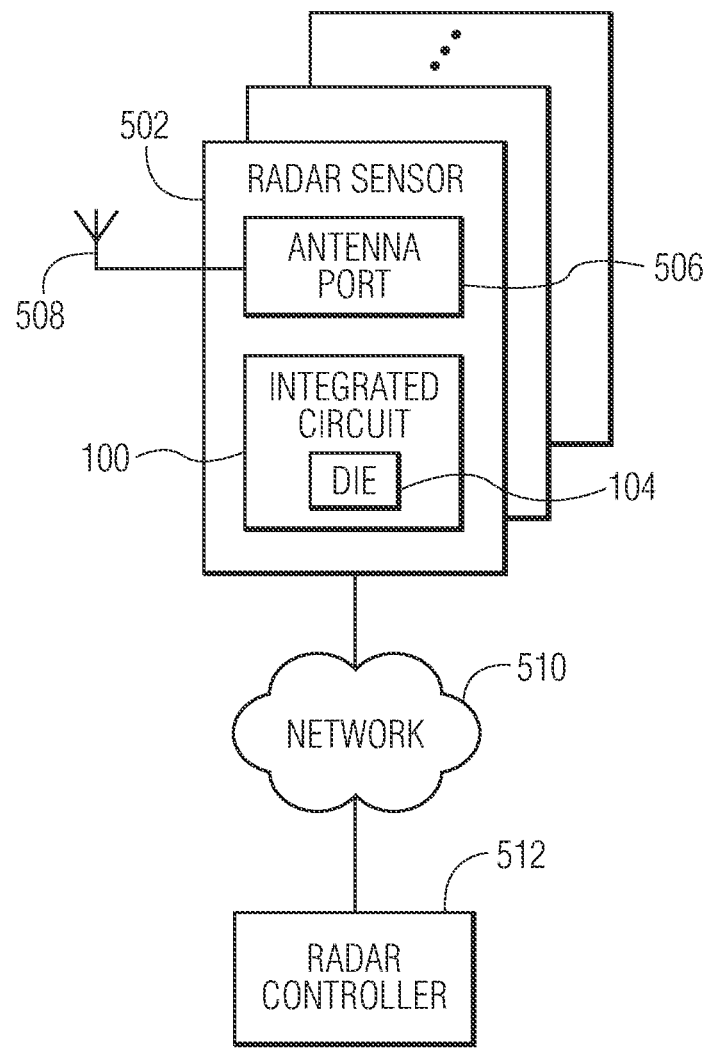
FIG. 5 illustrates a block diagram of an embodiment of a vehicle RADAR system in accordance with selected embodiments of the invention.

FIG. 5 illustrates a block diagram of an embodiment of a vehicle RADAR system 500 in accordance with selected embodiments of the invention. System 500 can include a RADAR sensor 502 having one or more antenna ports 506 coupled to one or more corresponding antennae 508, and packaged IC device 100 that includes processor die 104 on printed circuit board 206 (FIG. 2). Packaged IC device 100 may be a flip chip chip scale package or other suitable package format. RADAR sensor 502 may be used as, or as part of, a RADAR system for a vehicle such as an automobile. A number of RADAR sensors 502 may be included at different locations around the vehicle to enable collision avoidance, Adaptive Cruise Control (ACC), Autonomous Emergency Braking (AEB), blind Spot Detection (BSD), Cascaded Imaging Radar (IMR), Front/Rear Cross-traffic-Functions (FCTA/RCTA), Lane Change Assistance (LCA), Park Assist (PA), Reverse-Autonomous Emergency Braking (R-AEB) capability, and other functions. System 500 can further comprise network 510, such as a controller area network (CAN), FlexRay, and/or high-speed Ethernet network, that communicatively couples RADAR sensors 502 to RADAR controller 512 and/or other suitable processing devices.

Packaged IC device 100 emits a RADAR signal, and antenna 508 radiates the RADAR signal. If an object is near, the radiated RADAR signal may reflect off the object and the reflected signal may be received by antenna 508. Packaged IC device 100 may receive the reflected RADAR signal from antenna 508, and MMIC die 104 may process the reflected RADAR signal. MMIC die 104 may provide RADAR functionality and/or automobile RADAR functionality in some contexts. Die 104 transmits digital information about the RADAR signal or RADAR return to network 510.

RADAR controller 512 receives the digital information from network 510, processes the information, and determines whether an event or situation of interest is impending. In this situation, the RADAR controller 512 may send a warning or notification to a display or other device to issue a warning. In an embodiment, RADAR controller 512 may send a command to an automatic vehicle steering and braking controller to take action to avoid a collision, for example to steer away from the impending collision. Such collision avoidance steering commands may be conditioned on RADAR controller 512 determining, based on inputs from other RADAR sensors 502, that steering away from the impending collision does not steer into a different collision situation.

It is understood that IC device 100 taught herein may advantageously perform other functions and be used in other systems and designs, unrelated to automobile RADARs, that rely on a narrowband MMIC die 104. While an automobile RADAR MMIC is an exemplary embodiment of the teachings of the present disclosure, it is understood that application of these teachings to other non-automotive and non-RADAR applications is consistent with the present disclosure.

By now it should be appreciated that in some embodiments, there has been described a packaged integrated circuit that can comprise an integrated circuit (IC) die (104) having a first external contact and a second external contact (e.g. solder bumps of a BGA); a package substrate (e.g. 102, the layers including M1-M4 of FIG. 4), wherein the IC die can be attached to a first major surface of the package substrate, the package substrate including a balun in a first metal layer (e.g. M1, but could be any metal layer), wherein the balun can be connected to the first and the second external contacts of the IC die and candidly connected to a first external contact of the package substrate, wherein the first and second external contacts of the IC die can be configured to communicate a differential signal with the package substrate, and the first external contact of the package substrate can be configured to communicate a single-ended signal corresponding to the differential signal.

In another aspect, the balun comprises a conductive loop in the first metal layer.

In another aspect, the packaged integrated circuit can further comprise an encapsulant (202) on the first major surface of the package substrate, surrounding the IC die.

In another aspect, the package substrate can comprise a plurality of conductive pads (e.g. 412) connected to corresponding external contacts (e.g. solder bumps or contact pads) of the IC die.

In another aspect, the corresponding external contacts of the IC die, including the first and second external contacts, can form a portion of a ball grid array (BGA).

In another aspect, the package substrate can comprise a plurality of metal layers (M1-M4), including the first metal layer (e.g. M1) and a second metal layer (e.g. M4), wherein the second metal layer can comprise the first external contact (e.g. 432) of the package substrate.

In another aspect, the first metal layer can be stacked between the IC die and the second metal layer, and the first external contact can be exposed at a second major surface of the package substrate, opposite the first major surface of the package substrate.

In another aspect, the plurality of metal layers can further comprise a second external contact and a third external contact, wherein the first external contact can be immediately between the second and third external contacts (e.g. FIG. 3), wherein the second and third contacts can be configured to communicate a first supply voltage (e.g. GND).

In another aspect, the first supply voltage the ground.

In another aspect, the IC die can further comprise transceiver circuitry (e.g. 122-128 or 130-136) configured to receive or transmit the differential signal.

In another aspect, the IC die can be characterized as a monolithic microwave IC (MMIC) and the transceiver circuitry can be configured to receive and transmit the differential signal for millimeter (mm) wave applications.

In further embodiments, a packaged integrated circuit can comprise: an integrated circuit (IC) die (104) that can have a first external contact and a second external contact; a package substrate, wherein the IC die can be attached to a first major surface of the package substrate by way of a ball grid array (BGA) structure, the first and second external contacts of the IC die can correspond to contacts of the BGA structure, the package substrate having a plurality of metal layers. A first metal layer (e.g. M1, but could be any metal layer) can include a balun connected to the first and the second external contacts of the IC die, wherein the first and the second external contacts of the IC die can be configured to communicate a differential signal with the balun. A second metal layer (e.g. M4) can include a plurality of exposed conductive pads, wherein a first exposed conductive pad of the plurality of exposed conductive pads can be connected by at least one conductive via to the balun of the first metal layer.

In another aspect, the first external contact of the package substrate can be configured to communicate a single-ended signal corresponding to the differential signal.

In another aspect, the first external contact of the package substrate can be configured to communicate the single-ended signal with a single conductive trace on a printed circuit board (PCB) (e.g. 206).

In another aspect, the plurality of exposed conductive pads of the second metal layer can further comprise a second exposed conductive pad and a third exposed conductive pad, wherein the first exposed conductive pad can be immediately between the second and third exposed conductive pads, wherein each of the second and third exposed conductive pads can be configured to communicate a ground voltage with the PCB.

In another aspect, the packaged integrated circuit can further comprise an encapsulant on the first major surface of the package substrate, surrounding the IC die, wherein the plurality of exposed conductive pads are exposed at a second major surface of the package substrate, opposite the first major surface of the package substrate.

In another aspect, the IC die can be characterized as a monolithic microwave IC (MMIC) and comprises transceiver circuitry configured to receive and transmit the differential signal for millimeter (mm) wave applications.

In still further embodiments, a packaged integrated circuit can comprise: an integrated circuit (IC) die (104) having an external contact (e.g. solder bumps of a BGA); a package substrate (e.g. 102, the layers including M1-M4 of FIG. 4), wherein the IC die can be attached to a first major surface of the package substrate, the package substrate including a balun in a first metal layer (e.g. M1, but could be any metal layer), wherein the balun can be connected to the external contact of the IC die and to a first external contact of the package substrate and a second external contact of the package substrate, wherein the external contact of the IC die can be configured to communicate a single-ended signal with the package substrate, and the first and second external contacts of the package substrate can be configured to communicate a differential signal corresponding to the single-ended signal.

In another aspect, the package substrate can comprise a plurality of conductive pads (e.g. 412) connected to corresponding external contacts (e.g. solder bumps or contact pads) of the IC die, and the corresponding external contacts of the IC die, including the external contact of the IC die, form a portion of a ball grid array (BGA).

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Semiconductor and other types of electronic devices are often encapsulated wholly or partly in plastic resin to provide environmental protection and facilitate external connection to the devices. For convenience of explanation and not intended to be limiting, the present invention is described for semiconductor devices, but persons of skill in the art will understand that the present invention applies to any type of electronic device that is substantially in chip form. Accordingly, such other types of devices including the non-limiting examples given below, are intended to be included in the terms "device", "electronic device", "semiconductor device" and "integrated circuit" whether singular or plural, and the terms "device", "die" and "chip" are intended to be substantially equivalent. Non-limiting examples of suitable devices are semiconductor integrated circuits, individual semiconductor devices, piezoelectric devices, magnetostrictive devices, solid state filters, magnetic tunneling structures, integrated passive devices such as capacitors, resistors and inductors, and combinations and arrays of any and all of these types of devices and elements. Further, the present invention does not depend upon the types of die or chips being used nor the materials of which they are constructed provided that such materials withstand the encapsulation process.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate location or temporal or other prioritization of such elements.

What is claimed is:

1. A packaged integrated circuit, comprising:
   an integrated circuit (IC) die having a first external contact and a second external contact; a package substrate, wherein the IC die is attached to a first major surface of the package substrate, the package substrate including a balun in a first metal layer, wherein the balun is connected to the first and the second external contacts of the IC die and is connected to a first external contact of the package substrate, wherein the first and second external contacts of the IC die are configured to communicate a differential signal with the package substrate, and the first external contact of the package substrate is configured to communicate a single-ended signal corresponding to the differential signal.

2. The packaged integrated circuit of claim 1, wherein the balun comprises a conductive loop in the first metal layer.

3. The packaged integrated circuit of claim 1, further comprising an encapsulant on the first major surface of the package substrate, surrounding the IC die.

4. The packaged integrated circuit of claim 1, wherein the package substrate comprises a plurality of conductive pads connected to corresponding external contacts of the IC die.

5. The packaged integrated circuit of claim 4, wherein the corresponding external contacts of the IC die, including the first and second external contacts, form a portion of a ball grid array (BGA).

6. The packaged integrated circuit of claim 1, wherein the package substrate comprises a plurality of metal layers, including the first metal layer and a second metal layer, wherein the second metal layer comprises the first external contact of the package substrate.

7. The packaged integrated circuit of claim 6, wherein the first metal layer is stacked between the IC die and the second metal layer, and the first external contact is exposed at a second major surface of the package substrate, opposite the first major surface of the package substrate.

8. The packaged integrated circuit of claim 7, wherein the plurality of metal layers further comprises a second external contact and a third external contact, wherein the first external contact is immediately between the second and third external contacts, wherein the second and third contacts are configured to communicate a first supply voltage.

9. The packaged integrated circuit of claim 8, wherein the first supply voltage is ground.

10. The packaged integrated circuit of claim 1, wherein the IC die further comprises:
    transceiver circuitry configured to receive or transmit the differential signal.

11. The packaged integrated circuit of claim 10, wherein the IC die is characterized as a monolithic microwave IC (MMIC) and the transceiver circuitry is configured to receive and transmit the differential signal for millimeter (mm) wave applications.

12. A packaged integrated circuit, comprising:
    an integrated circuit (IC) die having a first external contact and a second external contact;
    a package substrate, wherein the IC die is attached to a first major surface of the package substrate by way of a ball grid array (BGA) structure, the first and second external contacts of the IC die corresponding to contacts of the BGA structure, the package substrate having a plurality of metal layers, wherein:
    a first metal layer includes a balun connected to the first and the second external contacts of the IC die, wherein the first and the second external contacts of the IC die are configured to communicate a differential signal with the balun, and
    a second metal layer includes a plurality of exposed conductive pads, wherein a first exposed conductive pad of the plurality of exposed conductive pads is connected by at least one conductive via to the balun of the first metal layer.

13. The packaged integrated circuit of claim 12, wherein the first external contact of the package substrate is configured to communicate a single-ended signal corresponding to the differential signal.

14. The packaged integrated circuit of claim 13, wherein the first external contact of the package substrate is configured to communicate the single-ended signal with a single conductive trace on a printed circuit board (PCB).

15. The packaged integrated circuit of claim 12, the plurality of exposed conductive pads of the second metal layer further comprises a second exposed conductive pad and a third exposed conductive pad, wherein the first exposed conductive pad is immediately between the second and third exposed conductive pads, wherein each of the second and third exposed conductive pads is configured to communicate a ground voltage with the PCB.

16. The packaged integrated circuit of claim 12, further comprising an encapsulant on the first major surface of the package substrate, surrounding the IC die, wherein the plurality of exposed conductive pads are exposed at a second major surface of the package substrate, opposite the first major surface of the package substrate.

17. The packaged integrated circuit of claim 12, wherein the IC die is characterized as a monolithic microwave IC (MMIC) and comprises transceiver circuitry configured to receive and transmit the differential signal for millimeter (mm) wave applications.

* * * * *